United States Patent [19]
Uda

[11] Patent Number: 5,412,264
[45] Date of Patent: May 2, 1995

[54] SIGNAL INPUT/OUTPUT CIRCUIT FOR SEMICONDUCTOR INTEGRATED CIRCUIT

[75] Inventor: Nobuya Uda, Itami, Japan

[73] Assignee: Mitsubishi Denki Kabushiki Kaisha, Tokyo, Japan

[21] Appl. No.: 128,788

[22] Filed: Sep. 30, 1993

[30] Foreign Application Priority Data

Jun. 4, 1993 [JP] Japan .................................. 5-134521

[51] Int. Cl.6 ........................................... H03K 17/687
[52] U.S. Cl. ..................................... 327/389; 327/434
[58] Field of Search ................ 307/571, 572, 577, 584, 307/549, 542, 272.3, 290, 242

[56] References Cited

FOREIGN PATENT DOCUMENTS 0122967 9/1979 Japan .................................. 307/272.3

*Primary Examiner*—William L. Sikes
*Assistant Examiner*—James A. Dudek
*Attorney, Agent, or Firm*—Lowe, Price, LeBlanc & Becker

[57] ABSTRACT

A signal input/output circuit for a semiconductor integrated circuit being provided with a reset signal input/output terminal 1 which inputs external reset requesting signal REQ from the outside of the semiconductor integrated circuit 10 and outputs internal reset requesting signal TWD generated at the inside, and a reset signal input circuit 3 which is connected to the reset signal input/output terminal 1 through the protection resistance 4 and generates reset signal RST resetting the semiconductor integrated circuit 10 when the external reset requesting signal REQ is inputted to the reset signal input/output terminal 1. In addition, the signal input/output circuit includes a first N-channel transistor 6 whose source is connected to the ground voltage source of the semiconductor integrated circuit 10 and whose drain is connected to the end of the reset signal input/output terminal 1 side of a protection resistance 4, and with a second N-channel transistor 7 whose source is connected to the ground voltage source of the semiconductor integrated circuit 10, and whose drain is connected to the end of the reset signal input circuit 3 side of the same.

14 Claims, 5 Drawing Sheets

SIGNAL INPUT/OUTPUT CIRCUIT FOR SEMICONDUCTOR INTEGRATED CIRCUIT

BACKGROUND OF THE INVENTIONS

1. Field of the Invention

The present invention relates to a signal input/output circuit for semiconductor integrated circuit, particularly to a signal input/output circuit for a semiconductor integrated circuit capable of preventing the semiconductor integrated circuit from generating an internal signal generated from the semiconductor integrated circuit itself when an output transistor thereof is destroyed or when a signal input/output terminal is short-circuited with a voltage source which negates signal output of the semiconductor integrated circuit.

2. Description of the Related Art

Figure 1:
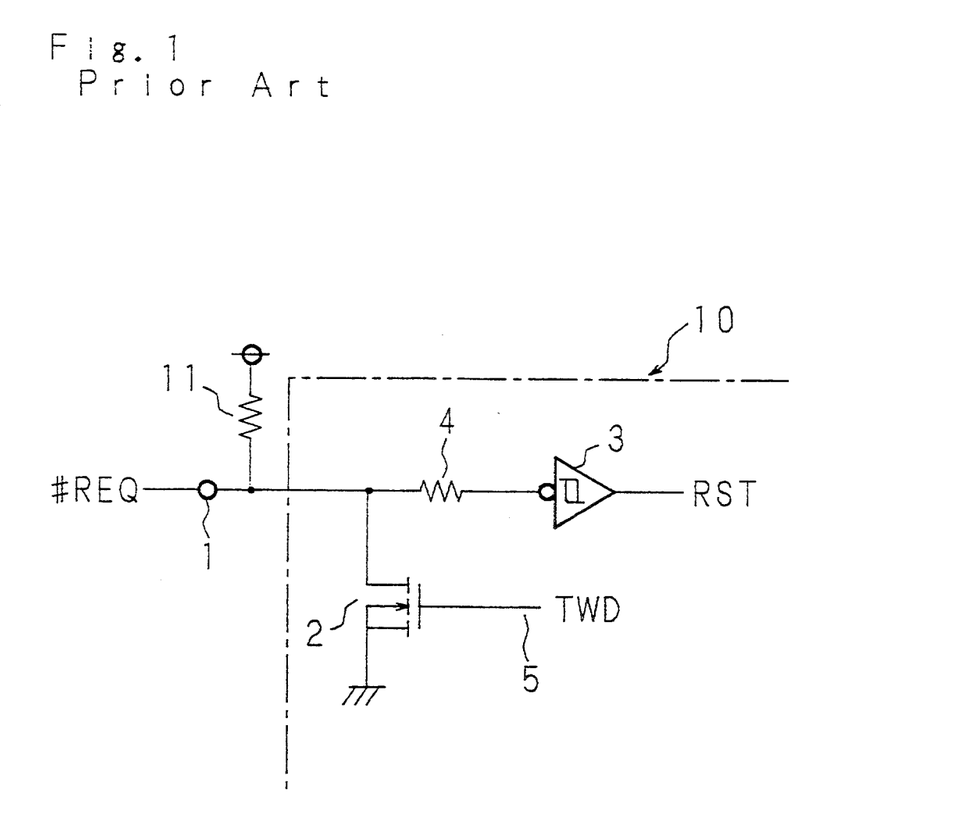
FIG. 1 is a circuit diagram showing a configuration example of a reset signal input/output circuit, as an example of a conventional signal input/output circuit for a semiconductor integrated circuit.

FIG. 1 is a circuit diagram showing a construction example of a reset, signal input/output circuit, as an example of a conventional signal input/output circuit for a semiconductor integrated circuit.

In FIG. 1, reference numeral 10 designates a semiconductor integrated circuit which is provided with a reset signal input/output terminal 1. The reset signal input/output terminal 1 is pulled up by a resistance 11 having a proper resistance value at the outside of the semiconductor integrated circuit 10.

At the inside of the semiconductor integrated circuit 10, there are provided an N-channel transistor 2 whose drain is connected to the reset signal input/output terminal 1, and a reset input circuit 3 being composed, for example, of a schmitt trigger gate, whose negative logic input end is connected to the reset signal input/output terminal 1 through a protection resistance 4.

A source of the N-channel transistor 2 is connected to the ground voltage source of the semiconductor integrated circuit 10, and a gate of the same is connected to a signal line 5.

The signal line 5 is the one for receiving an internal reset requesting signal TWD whose active level is "H" and which is generated from a circuit (not shown) inside of the semiconductor integrated circuit 10 when semiconductor integrated circuit 10 judges that it is necessary to be reset itself, to the gate of the N-channel transistor 2.

Accordingly, since the N-channel transistor 2 is on when the "H" level internal reset requesting signal TWD is given to the N-channel transistor 2 through the signal line 5, the reset signal input/output terminal 1 is connected to the ground voltage source and becomes "L" level. At the same time, since a negative logic input end of the reset input circuit 3 for resetting the semiconductor integrated circuit 10 also becomes "L" level, the reset signal RST which is the output signal of the reset input circuit 3 becomes active level ("H" level). That is, the signal line 5 is also a reset requesting signal line of the semiconductor integrated circuit 10 itself.

Next, explanation will be given on the operation of a conventional reset signal input/output circuit shown in FIG. 1.

Usually, to the reset signal input/output terminal 1, an external reset requesting signal #REQ of nonactive level (in this case, "H" level) is inputted, and internal reset requesting signal TWD is "L" level. In this usual state, since the N-channel transistor 2 is off, the external reset requesting signal #REQ of "H" level is inputted to the negative logic input end of the reset input circuit 3 from the reset signal input/output terminal 1. Accordingly, the reset input circuit 3 outputs the reset signal RST of "L" level obtained by inverting input level to the negative logic input end thereof.

When it is necessary to reset the semiconductor integrated circuit 10 from the outside, active level signal, in this case, the external reset requesting signal #REQ of "L" level is inputted to the reset signal input/output terminal 1. Thereby, since "L" level signal is input ted to the negative logic input end of the reset input circuit 3, the reset input circuit 3 inverts the inputted level and outputs the reset signal RST of active level ("H" level) into the semiconductor integrated circuit 10.

On the other hand, when the semiconductor integrated circuit 10 itself judges or determines that it is necessary to be reset, the internal reset requesting signal TWD of "H" level is generated by a circuit (not shown) inside of the semiconductor integrated circuit 10. The internal reset requesting signal TWD of "H" level is given or transmitted to the gate of the N-channel transistor 2 through the signal line 5, thereby the N-channel transistor 2 is on to connect the reset signal input/output terminal 1 with the ground voltage source, therefore the reset signal input/output terminal 1 becomes "L" level. Accordingly, from the outside of the semiconductor integrated circuit 10, it becomes possible to know the generation or state (to become "H" level) of the internal reset requesting signal TWD by the fact that the reset signal input/output terminal 1 becomes "L" level. At the same time, since "L" level signal is inputted to the negative logic input end of the reset input circuit 3 connected to the reset signal input/output terminal 1, the reset input circuit 3 inverts the inputted level and outputs the reset signal RST of active level ("H" level).

In the aforementioned reset signal input/output circuit as a conventional signal input/output circuit for a semiconductor integrated circuit shown in FIG. 1, when the reset signal input/output terminal, for example, is connected with polarity which does not generate reset, "H" level potential, to be concrete, in low impedance, since level of the reset signal input/output terminal is voltage divided even when the semiconductor integrated circuit itself generates internal reset requesting signal, the level does not become "L" level, and the semiconductor integrated circuit is not reset.

Even when N-channel transistor is destroyed due to static electricity or the like and signal of "L" level can't be outputted, potential of reset signal input/output terminal does not become "L" level, therefore resetting of the semiconductor integrated circuit itself is not carried out.

When the circuit falls into such a state, there is a possibility that is enters running state, since not only reset requesting signal to the outside can't be outputted but also the semiconductor integrated circuit itself is not reset.

SUMMARY OF THE INVENTION

The present invention has been devised in view of such circumstances, and the object thereof is to provide a signal input/output circuit for a semiconductor integrated circuit, which enables the semiconductor integrated circuit itself to recognize the generation of its signal by the internal signal generated at the inside of the semiconductor integrated circuit, even when the signal input/output terminal is connected with polarity which does not generate signal in low impedance.

The signal input/output circuit for the semiconductor integrated circuit, related to the invention is provided with a signal input/output terminal which not only input external signal from the outside of the semiconductor integrated circuit but outputs internal signal generated at the inside of the semiconductor integrated circuit to the outside as well; an internal signal outputting means for, when the internal signal is generated, outputting it from the signal input/output terminal to the outside; and a signal generating means for generating predetermined signal at the inside of the semiconductor integrated circuit when the external signal is inputted to the signal input/output terminal or when the internal signal is outputted from the signal input/output terminal; and further, means for making the signal generating means generate predetermined signal when the internal signal is generated.

In the signal input/output circuit for the semiconductor integrated circuit of the invention, when the internal signal is generated, predetermined signal is generated by signal generating means regardless of controlling the level of the signal input/output terminal done by the internal signal outputting means.

The above and further objects and features of the invention will more fully be apparent from the following detailed description with accompanying drawings.

DESCRIPTION OF THE PREFERRED EMBODIMENTS

In the following, explanation will be made in detail on the invention referring to drawings showing the embodiments thereof.

Figure 2:
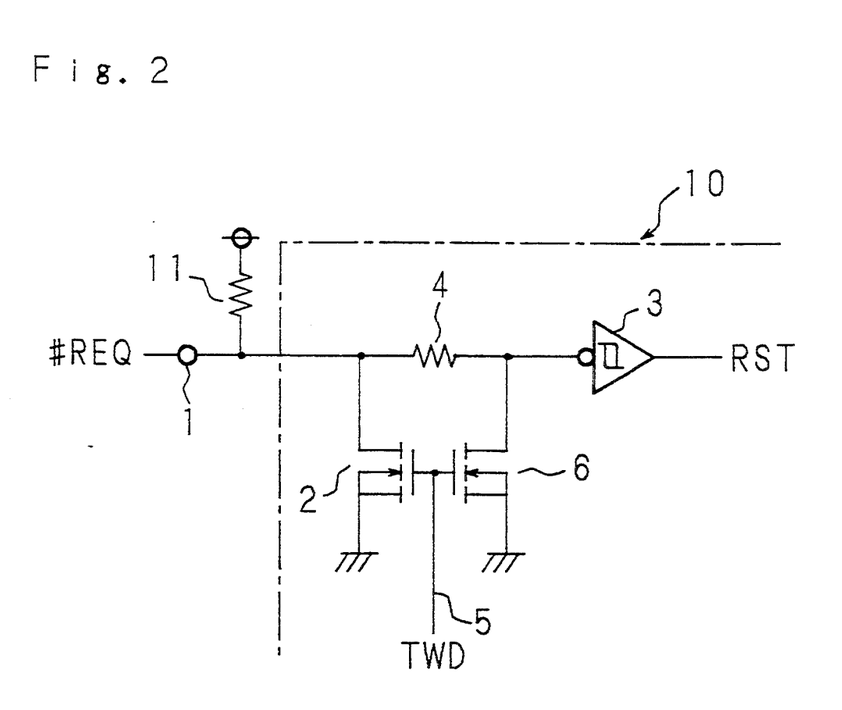
FIG. 2 is a circuit diagram showing a configuration of one embodiment of the first invention when a signal input/output circuit for a semiconductor integrated circuit related to the invention is applied to a reset signal input/output circuit.

FIG. 2 is a circuit diagram showing a configuration of one embodiment of a first invention when a signal input/output circuit for a semiconductor integrated circuit related to the invention is applied to a reset signal input/output circuit.

In FIG. 2, the same reference symbols in FIG. 1 referred in the explanation of the aforementioned conventional example show the same or corresponding portions.

In FIG. 2, reference numeral 10 designates a semiconductor integrated circuit which is provided with a reset signal input/output terminal 1. The reset signal input/output terminal 1 is pulled up by a resistance 11 having a proper resistance value at the outside of the semiconductor integrated circuit 10.

At the inside of the semiconductor integrated circuit 10, there are provided a first N-channel transistor 2 whose drain is connected to the reset signal input/output terminal 1, a reset input circuit 3 as a signal generating circuit (means) composed, for example, of a schmitt trigger gate, whose negative logic input end is connected to the reset signal input/output terminal 1 through a protection resistance 4, and a second N-channel transistor 6 for self resetting, whose drain is connected to the reset signal input/output terminal 1 through the protection resistance 4 similarly.

Both the sources of the N-channel transistors 2 and 6 are connected to the ground voltage source of the semiconductor integrated circuit 10 and both the gates of the N-channel transistors 2 and 6 are connected to a signal line 5.

The signal line 5 supplies the active internal reset requesting signal TWD whose active level is "H" and which is generated by a circuit (not shown) provided inside of the semiconductor integrated circuit 10, to the gates of the N-channel transistors 2 and 6, when the semiconductor integrated circuit 10 itself judges that it is necessary to be reset.

Accordingly, when the internal reset requesting signal TWD of "H" level is given to the gate of the N-channel transistor 2 through the signal line 5, the N-channel transistor 2 is on, therefore the reset signal input/output terminal 1 is connected to the ground voltage source and become "L" level. That is, the N-channel transistor 2 functions as an internal signal outputting means for outputting the internal reset requesting signal TWD being internal signal to the outside of the semiconductor integrated circuit 10 from the reset signal input/output terminal 1.

At the same time, since the internal reset requesting signal TWD of "H" level is supplied also to the gate of the N-channel transistor 6, the N-channel transistor 6 is on, and the negative logic input end of the reset input circuit 3 is connected to the ground voltage source and becomes "L" level. Therefore, the reset signal RST which is the output signal of the reset input circuit 3 for resetting the semiconductor integrated circuit 10 becomes active level ("H" level).

That is, the signal line 5 is the one for reset requesting of the semiconductor integrated circuit 10 itself, and the N-channel transistor 6 functions as an N-channel transistor for self resetting which makes the negative logic input end of the reset input circuit 3 become "L" level forcibly and to output the reset signal RST of active level ("H" level) regardless of the level of the reset signal input/output terminal 1, in other words, as means for making the reset input circuit 3 being signal generating means generate the reset signal RST.

Next, explanation will be given on the operation of the first embodiment of the case where the signal input/output circuit for the semiconductor integrated circuit of the invention configured in such a way is applied to the reset signal input/output circuit.

In addition, the on-resistance of the N-channel transistor 6 and the resistance value of the input protection resistance 4 satisfy the following inequality (1) in the case where Vi=Vcc, for example, when on-resistance of the N-channel transistor 6 is R, input protection resistance value of the protection resistance 4 is r, voltage of the reset signal input/output terminal 1 is Vi, threshold voltage of the reset input circuit 3 is Vth1, and source voltage is Vcc.

$$(R \times Vcc)/(R+r) < Vth1 \quad (1)$$

Usually, to the reset signal input/output terminal 1, the external reset requesting signal #REQ of nonactive level (in this case, "H" level) is inputted, and the internal reset requesting signal TWD is "L" level. In this usual state, both the N-channel transistors 2 and 6 are off, to the negative logic input end of the reset input circuit 3, the external reset requesting signal #REQ of "H" level is inputted from the reset signal input/output terminal 1. Accordingly, the reset input circuit 3 outputs "L" level, which is obtained by inverting the input level to the negative logic input end thereof, as the reset signal RST of nonactive level.

When it is necessary to reset the semiconductor integrated circuit 10 from the outside, the external reset requesting signal #REQ of active level (in this case, "L" level) is inputted to the reset signal input/output terminal 1. Thereby, since "L" level signal is inputted to the negative logic input end of the reset input circuit 3, the reset input circuit 3 outputs the reset signal RST of active level ("H" level) to the inside of the semiconductor integrated circuit 10. The operation is same as that in the conventional example.

On the other hand, when the semiconductor integrated circuit 10 itself judges that it is necessary to be reset, the internal reset requesting signal TWD of "H" level is generated by a circuit (not shown) inside of the semiconductor integrated circuit 10. By the fact that the internal reset requesting signal TWD of "H" level is given to the gate of the N-channel transistor 2 through the signal line 5, the N-channel transistor 2 is on and makes the reset signal input/output terminal 1 connect with the ground voltage source, thereby the reset signal input/output terminal 1 becomes "L" level.

Accordingly, from the outside of the semiconductor integrated circuit 10, it becomes possible to know the generation (to have become "H" level) of the internal reset requesting signal TWD by the fact that the reset signal input/output terminal 1 becomes "L" level. At the same time, since the internal reset requesting signal TWD of "H" level is supplied also to the gate of the N-channel transistor 6, the N-channel transistor 6 is also on, and the negative logic input end of the reset input circuit 3 is connected with the ground voltage source and becomes "L" level. Thereby, the reset signal RST of "H" level is outputted to the inside of the semiconductor integrated circuit 10.

Figure 3:
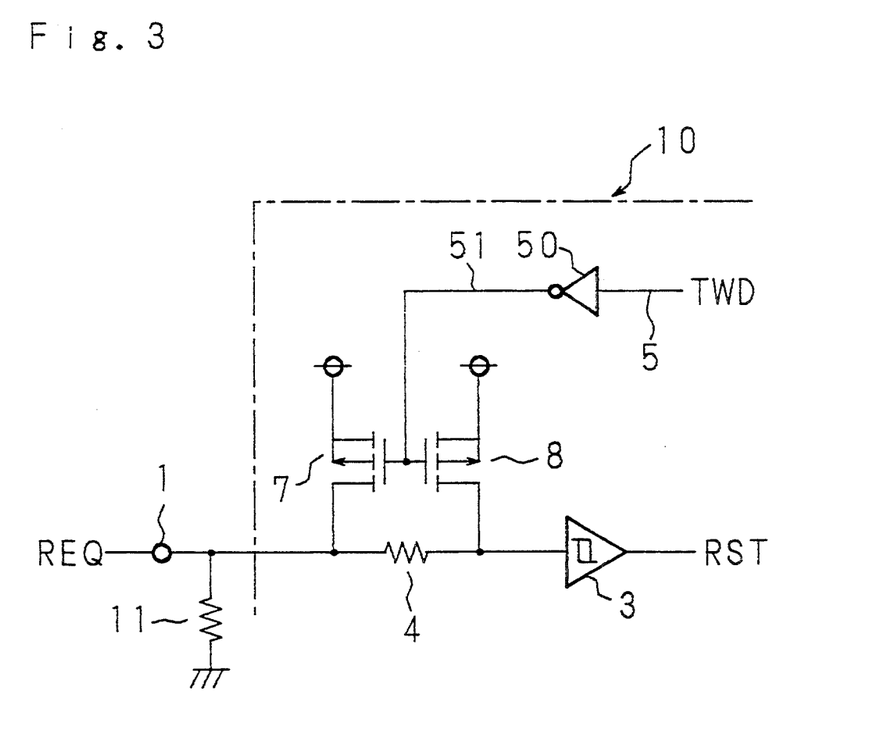
FIG. 3 is a circuit diagram showing a configuration of one embodiment of the second invention when a signal input/output circuit for a semiconductor integrated circuit related to the invention is applied to a reset signal input/output circuit.

FIG. 3 is a circuit diagram showing a configuration of one embodiment of a second invention of the case where a signal input/output circuit for a semiconductor integrated circuit related to the invention is applied t a reset signal input/output circuit.

In addition, in FIG. 3, in place of the two N-channel transistors 2 and 6 used in the aforementioned first invention, two P-channel transistors are used.

In FIG. 3, reference numeral 10 designates a semiconductor integrated circuit which is provided with a reset signal input/output terminal 1. The reset signal input/output terminal 1 is pulled down by a resistance 11 having a proper resistance value at the outside of the semiconductor integrated circuit 10.

At the inside of the semiconductor integrated circuit 10, there are provided a first P-channel transistor 7 whose drain is connected to the reset signal input/output terminal 1, a reset input circuit 3 as a signal generating circuit (means) composed, for example, of a schmitt trigger gate, whose input end is connected to the reset, signal input/output terminal 1 through the protection resistance 4, and a second P-channel transistor 8 for self-resetting whose drain is connected to the reset signal input/output terminal 1 through the protection resistance 4 similarly.

Both the sources of the P-channel transistors 7 and 8 are connected to the positive voltage source of the semiconductor integrated circuit 10, and both the gates of the P-channel transistors 7 and 8 are connected to a signal line 51.

The signal line 51 supplies the internal reset requesting signal TWD, whose active level is "H" and which is generated by a circuit (not shown) provided inside of the semiconductor integrated circuit 10, to the gates of the P-channel transistors 7 and 8 through the inverter 50 when the semiconductor integrated circuit 10 itself judges that it is necessary to be reset.

Accordingly, when the internal reset requesting signal TWD of "H" level is given to the inverter 50 from the signal line 5 to be inverted to be "L" level, and further given to the gate of the P-channel transistor 7 through the signal line 51, the P-channel transistor 7 is on and the reset signal input/output terminal 1 and the positive voltage source are connected to each other, therefore the reset signal input/output terminal 1 becomes "H" level. That is, the P-channel transistor 7 functions as internal signal outputting means for outputting the internal reset requesting signal TWD being internal signal from the reset signal input/output terminal 1 to the outside of the semiconductor integrated circuit 10.

At the same time, also to the gate of the P-channel transistor 8, "L" level signal is given from the signal line 51 to connect the input end of the reset input circuit 3 and the positive voltage source, therefore the reset input circuit 3 makes the reset signal RST, being the output signal thereof for resetting the semiconductor integrated circuit 10, become active ("H" level).

That is, the signal line 5 is the one for reset requesting for the semiconductor integrated circuit 10 itself, and the P-channel transistor 8 functions as a P-channel transistor for self-resetting, which forcibly makes the potential of the input end of the reset input circuit 3 become "H" level regardless of the state of the reset signal input/output terminal 1 to make the reset signal RST of active level ("H" level) be outputted, in other words, as means for making the reset input circuit 3 being the signal generating means generate the reset signal RST.

In the following, explanation will be given on the operation of the second invention of the case where the signal input/output circuit for the semiconductor integrated circuit of the invention so configured as aforementioned, will be described.

In addition, when on-resistance of the P-channel transistor 8 is R, input protection resistance value of the protection resistance 4 is r, voltage of the reset signal input/output terminal 1 is Vi, threshold voltage of the reset input circuit 3 is Vth2, and voltage source is Vcc, the on-resistance R of the P-channel transistor 8 and the resistance value r of the input protection resistance 4 satisfy the following inequality (2), in the case where Vi=Vcc, for example.

$$(r \times Vcc)/(R+r) > Vth2 \qquad (2)$$

usually, to the reset signal input/output terminal 1, the external reset requesting signal REQ of nonactive level (in this case, "L" level) is inputted, and the internal reset requesting signal TWD is "L" level. In this usual state, since both the P-channel transistors 7 and 8 are off, "L" level signal is inputted from the reset signal input/output terminal 1 to the negative logic, input end of the reset input, circuit 3. Accordingly, the reset input circuit 3 outputs signal of "L" level, which is input level to the input end thereof, intact as the reset signal RST of nonactive level.

When it is necessary to reset the semiconductor integrated circuit 10 from the outside, the external reset requesting signal REQ of active level (in this case, "H" level) is inputted to the reset signal input/output terminal 1. Thereby, the reset input circuit 3 outputs the reset signal RST of active level ("H" level) to the inside of the semiconductor integrated circuit 10. The operation is same as that in the conventional example except that the active level of the input signal to the reset signal input/output terminal 1 differs from the conventional example.

On the other hand, when the semiconductor integrated circuit 10 itself judges that it is necessary to be reset, the internal reset requesting signal TWD of "H" level is generated from a circuit (not shown) provided inside of the semiconductor integrated circuit 10. By the fact that the "L" level signal obtained by inverting the internal reset requesting signal TWD of the "H" level by the inverter 50 is given to the gate of the P-channel transistor 7 through the signal line 51, the P-channel transistor 7 is on, thereby the reset signal input/output terminal 1 is connected with the positive voltage source to become "H" level. Accordingly, it becomes possible to know the generation (to have become active) of the internal reset requesting signal TWD from the outside of the semiconductor integrated circuit 10, by the fact that the reset signal input/output terminal 1 becomes "H" level.

At the same time, also to the gate of the P-channel transistor 8, "L" level signal same as that given to the gate of the P-channel transistor 7 is given from the signal line 51, the input end of the reset input circuit 3 is connected to the positive voltage source to become "H" level, and the reset signal RST of "H" level is outputted to the inside of the semiconductor integrated circuit 10 from the reset input circuit 3.

Figure 4:
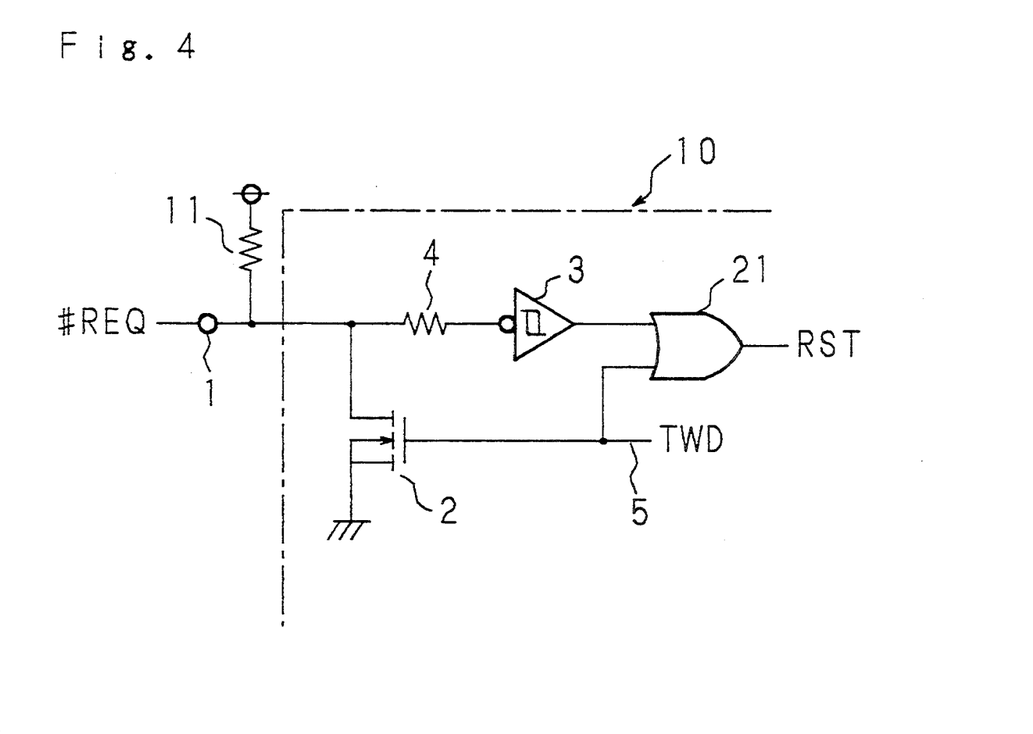
FIG. 4 is a circuit diagram showing a configuration of one embodiment of the third invention when a signal input/output circuit for a semiconductor integrated circuit related to the invention is applied to a reset signal input/output circuit.

FIG. 4 is a circuit diagram showing a configuration of one embodiment of a third invention of the case where a signal input/output circuit of the semiconductor integrated circuit of the invention is applied to a reset signal input/output circuit.

In addition, the same reference symbols as those in FIG. 2 referred to in the explanation of the aforementioned first, invention designate the same or corresponding portions.

In FIG. 4, reference symbol 10 designates a semiconductor integrated circuit which is provided with a reset signal input/output terminal 1. The reset signal input/output terminal 1 is pulled up by a resistance 11 having a proper resistance value at the outside of the semiconductor integrated circuit 10.

At the inside of the semiconductor integrated circuit. 10, there are provided an N-channel transistor 2 whose drain is connected to the reset signal input/output terminal 1, a reset input circuit 3 as a signal generating circuit composed, for example, of a schmitt trigger gate, whose negative logic input end is connected to the reset signal input/output terminal 1 through the protection resistance 4, and an OR gate 21 as logical sum operating means whose one input is connected to the output of the reset input circuit 3.

A source of the N-channel transistor 2 is connected to the ground voltage source of the semiconductor integrated circuit 10, and a gate of the same is to the signal line 5.

The signal line 5 supplies the internal reset requesting signal TWD, whose active level is "H" and which is generated by a circuit (not shown) provided inside of the semiconductor integrated circuit 10, to the gate of the N-channel transistor 2, when the semiconductor integrated circuit 10 itself judges that it is necessary to be reset. The signal line 5 is also connected to the other input of the aforementioned OR gate 21.

Accordingly, the internal reset requesting signal TWD of "H" level is given to the gate of the N-channel transistor 2 through the signal line 5, since the N-channel transistor 2 is on to make the reset signal input/output terminal 1 connect to the ground voltage source, the level of the reset signal input/output terminal 1 becomes "L" level. That is, the N-channel transistor 2 functions as internal signal outputting means for outputting the internal reset requesting signal TWD being internal signal from the reset signal input/output terminal 1 to the outside of the semiconductor integrated circuit 10.

At the same time, the same signal is given to the other input of the OR gate 21. Thereby, regardless of the output signal of the reset input circuit 3, the OR gate 21 makes the reset signal RST which is the output signal thereof for resetting the semiconductor integrated circuit 10, become active level ("H" level). That is, according to the third invention shown in FIG. 4, signal generating means is configured by the reset input circuit 3 and the OR gate 21, and the signal line 5 functions as means for generating the reset signal RST.

In the following, explanation will be given on the operation of the third invention of the case where a signal input/output circuit for a semiconductor integrated circuit of the invention so configured as aforementioned is applied to a reset signal input/output circuit.

Usually, to the reset signal input/output terminal 1, the external reset requesting signal #REQ of nonactive level (in this case, "H" level) is inputted, and the internal reset requesting signal TWD is "L" level. In this usual state, since the N-channel transistor 2 is off, to the negative logic input end of the reset input circuit 3, "H" level signal is inputted from the reset signal input/output terminal 1, therefore the level of the output signal of the reset input circuit 3 becomes "L" level. Accordingly, since both inputs of the OR gate 21 are "L" level, the reset signal RST being the output signal therefrom is "L" level.

When it is necessary to reset the semiconductor integrated circuit 10 from the outside, the external reset requesting signal #REQ of active level (in this case, "L" level) is inputted to the reset signal input/output terminal 1. Thereby, since the negative logic input end of the reset input circuit 3 becomes "L" level, the reset input circuit 3 outputs "H" level signal obtained by inverting the inputted level. Accordingly, the OR gate 21 outputs the reset signal RST of active level ("H"

level) to the inside of the semiconductor integrated circuit 10.

On the other hand, when the semiconductor integrated circuit 10 itself judges that it is necessary to reset, the internal reset, requesting signal TWD of "H" level is generated by a circuit (not shown) provided inside of the semiconductor integrated circuit 10. By the fact that the internal reset requesting signal TWD of "H" level is given to the gate of the N-channel transistor 2, the N-channel transistor 2 is on to connect the reset signal input/output terminal 1 and the ground voltage source, and the reset signal input/output terminal 1 becomes "L" level. Accordingly, from the outside of the semiconductor integrated circuit 10, it becomes possible to know the generation (to have become "H" level) of the internal reset requesting signal TWD by the fact that the reset signal input/output terminal 1 becomes "L" level.

Since the internal reset requesting signal TWD of "H" level given to the gate of the N-channel transistor 2 is also given to the other input end of the OR gate 21, the reset signal RST being the output signal of the OR gate 21 becomes active, that is, "H" level and is outputted to the inside of the semiconductor integrated circuit 10.

Figure 5:
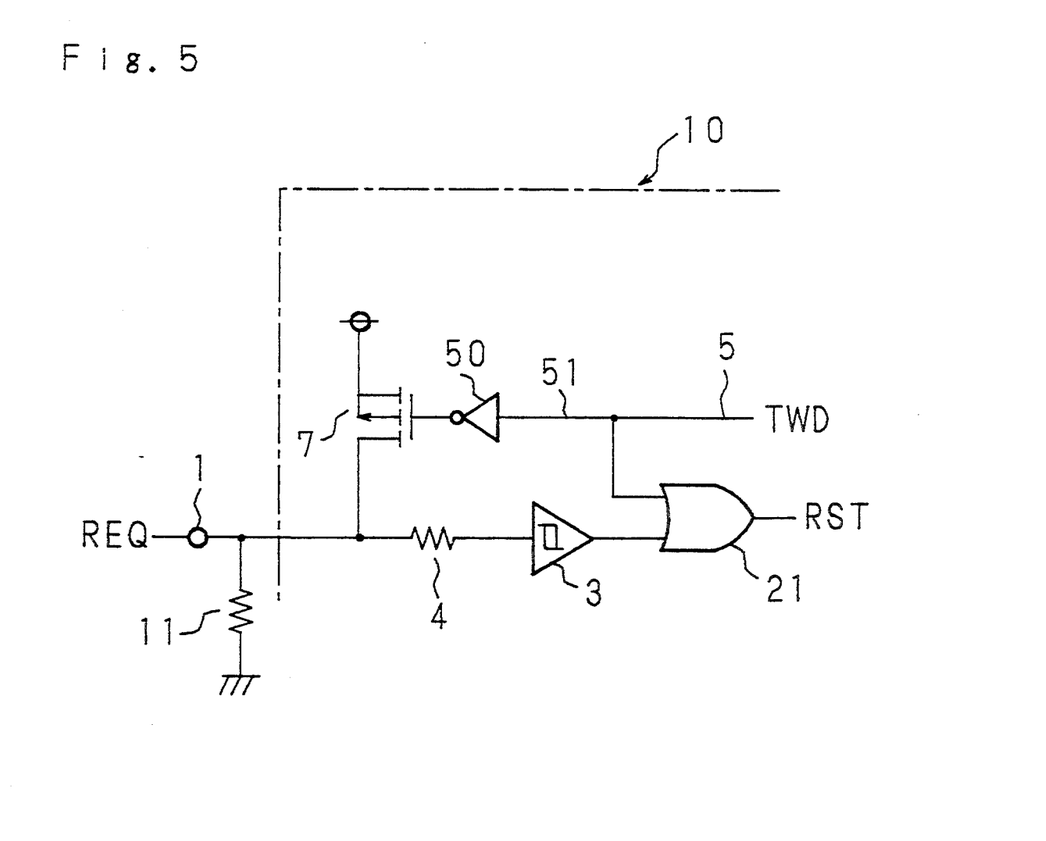
FIG. 5 is a circuit, diagram showing a configuration of one embodiment of the fourth invention when a signal input/output circuit for a semiconductor integrated circuit related to the invention is applied to a reset signal input/output circuit.

FIG. 5 is a circuit diagram showing a configuration of one embodiment of a fourth invention of the case where a signal input/output circuit of a semiconductor integrated circuit related to the invention is applied to a reset signal input/output circuit.

In addition, in FIG. 5, reference symbols same as those in FIG. 4 referred to in the explanation of the aforementioned third invention designate the same or corresponding portions.

In FIG. 5, reference numeral 10 designates a semiconductor integrated circuit which is provided with a reset signal input/output terminal 1. The reset signal input/output terminal 1 is pulled down by a resistance 11 having a proper resistance value at the outside of the semiconductor integrated circuit 10.

At the inside of the semiconductor integrated circuit 10, there are provided a P-channel transistor 7 whose drain is connected to the reset signal input/output terminal 1 a reset input circuit 3 as a signal generating circuit composed, for example, of a schmitt trigger gate, whose input end is connected to the reset signal input/output terminal 1 through the protection resistance 4, and an OR gate 21 as logical sum operating means whose one input is connected to the output of the reset input circuit 3.

A source of the P-channel transistor 7 is connected to the positive voltage source of the semiconductor integrated circuit 10, and a gate of the same is connected to the signal line 51.

The signal line 51 gives the reset requesting signal RST, whose active level is "H" and which is generated by a circuit (no shown) provided inside of the semiconductor integrated circuit 10, to the gate of the P-channel transistor 7 through the inverter 50. In addition, to an other input of the aforementioned OR gate 21, the signal line 5 is directly connected.

Accordingly, when the reset requesting signal TWD of "H" level is supplied to the inverter 50 from the signal line 5 and is inverted to be "L" level, and further supplied to the gate of the P-channel transistor 7 through the signal line 51, the P-channel transistor 7 is on thereby the signal input/output terminal 1 is connected to the positive voltage source, therefore the reset signal input/output terminal 1 becomes "H" level. That is, the P-channel transistor 7 functions as internal signal outputting means for making the internal reset requesting signal TWD, which is internal signal, output from the reset input/output terminal 1 to the outside of the semiconductor integrated circuit 10.

At the same time, from the signal line 5, "H" Level signal is given to the other input of the OR gate 21. Thereby, regardless of output signal of the reset input circuit 3, the OR gate 21 makes the reset signal RST, which is the output signal thereof, for resetting the semiconductor integrated circuit 10 become active level ("H" level). In other words, according to the fourth invention shown in FIG. 5, the reset input circuit 3 and the OR gate 21 form signal generating means, and the signal line 5 functions as means for generating the reset signal RST.

In the following, explanation will be given on the operation of the fourth invention of the case where a signal input/output circuit for a semiconductor integrated circuit of the invention so configured as aforementioned is applied to a reset signal input/output circuit.

Usually, to the reset signal input/output terminal 1, the external reset requesting signal REQ of nonactive level (in this case, "L" level) is inputted, and the internal reset requesting signal TWD is "L" level. In this usual state, since the N-channel transistor 7 is off, to the input end of the reset input circuit 3, "L" Level signal is inputted from the reset signal input/output terminal 1. Accordingly, the reset input circuit 3 outputs signal of "L" level being the input level to the input end thereof intact as the reset signal RST of nonactive level.

When it is necessary to reset the semiconductor integrated circuit 10 from the outside, the external reset requesting signal REQ of active level (in this case, "H" level) is inputted to the reset signal input/output terminal 1. Thereby, since the reset input circuit, 3 outputs "H" level signal, the OR gate 21 outputs the reset signal RST of active level ("H" level) to the inside of the semiconductor integrated circuit 10.

On the other hand, when the semiconductor integrated circuit 10 itself judges that it is necessary to be reset, the internal reset requesting signal TWD of "H" level is generated by a circuit (not shown) provided inside of the semiconductor integrated circuit 10. By the fact that the internal reset requesting signal TWD of "L" level is given to the gate of the P-channel transistor 7, the P-channel transistor 7 is on to make the potential of the reset signal input/output terminal 1 become "H" level. Accordingly, from the outside of the semiconductor integrated circuit 10, it becomes possible to know the generation (to have become "H" level) of the internal reset requesting signal TWD by the fact that the reset signal input/output terminal 1 becomes "H" level.

Since the internal reset requesting signal TWD of "H" level is given to the other input of the OR gate 21 from the signal line 5, the reset signal RST being the output signal of the OR gate 21 becomes active, that is, "H" level regardless of the output signal of he reset input-circuit 3 and is outputted to the inside of the semiconductor integrated circuit 10.

In addition, in the embodiment of the respective inventions aforementioned, explanation was given on the case where the preset invention was applied to a reset signal input/output circuit, however, it is needless to say that the invention can be applied, for example, to an interrupt signal or the like, in the case where inputting of the external signal and outputting of the internal signal generated at the inside of the semiconductor integrated circuit are performed by the same signal input/output terminal.

As aforementioned, according to the first, and second inventions of the signal input/output circuit for the semiconductor integrated circuit of the invention, even when a signal input/output terminal is short-circuited with potential of a polarity not generating external signal in low impedance at the outside of the semiconductor integrated circuit, it is possible for the signal generating circuit to recognize the generation of the signal generating circuit is voltage divided by protection resistance and on-resistance of the second N-channel transistor or P-channel transistor.

And, according to the third and fourth inventions, even when a signal input/output terminal is short-circuited with potential of polarity which not generating external signal in low impedance at the outside of the semiconductor integrated circuit, it is possible to recognize the generation of the internal signal by outputting the internal signal of the semiconductor integrated circuit by the logical sum operating means.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A signal input/output circuit for a semiconductor integrated circuit, comprising:
    a signal input/output terminal which inputs an external signal from the outside of said semiconductor integrated circuit as well as outputs an internal signal generated at the inside of said semiconductor integrated circuit to the outside of said semiconductor integrated circuit;
    internal signal outputting means for, when said internal signal is generated, outputting said internal signal from said signal input/output terminal to the outside of said semiconductor integrated circuit;
    signal generating means for generating a predetermined signal at the inside of said semiconductor integrated circuit when said external signal is input to said signal input/output terminal or when said internal signal is output from said signal input/output terminal; and
    means for making said signal generating means generate said predetermined signal when said internal signal is generated, said means for making including first and second transistors.

2. A signal input/output circuit for a semiconductor integrated circuit, comprising:
    a signal input/output terminal which inputs an external signal from the outside of said semiconductor integrated circuit as well as outputs an internal signal generated at the inside of said semiconductor integrated circuit to the outside of said semiconductor integrated circuit;
    a signal generating circuit which is connected to said signal input/output terminal through a resistance and generates a predetermined signal at the inside of said semiconductor integrated circuit when said external signal is input to said signal input/output terminal;
    a first N-channel transistor whose source is connected to a ground voltage source of said semiconductor integrated circuit, and whose drain is connected to the end of said signal input/output terminal side of said resistance, and which, when said internal signal is transmitted to the gate, said first N-channel transistor transmits said internal signal from said signal input/output terminal to the outside of said semiconductor integrated circuit; and
    a second N-channel transistor whose source is connected to the ground voltage source of said semiconductor integrated circuit, and whose drain is connected to the end of said signal generating circuit side of said resistance, and which makes said signal generating circuit generate said predetermined signal when said internal signal is transmitted to the gate thereof.

3. A signal input/output circuit for a semiconductor integrated circuit, comprising:
    a signal input/output terminal which inputs an external signal from the outside of said semiconductor integrated circuit as well as outputs an internal signal generated at the inside of said semiconductor integrated circuit to the outside of said semiconductor integrated circuit;
    a signal generating circuit which is connected to said signal input/output terminal through a resistance and generates a predetermined signal at the inside of said semiconductor integrated circuit when said external signal is input to said signal input/output terminal;
    a first P-channel transistor whose source is connected to the positive voltage source of said semiconductor integrated circuit, and whose drain is connected to the end of said signal input/output terminal side of said resistance, and which, when said internal signal is transmitted to the gate, said first P-channel transistor transmits said internal signal from said signal input/output terminal to the outside of said semiconductor integrated circuit; and
    a second P-channel transistor whose source is connected to the positive voltage source of said semiconductor integrated circuit, and whose drain is connected to the end of said signal generating circuit side of said resistance, and which makes said signal generating circuit generate said predetermined signal when said internal signal is transmitted to the gate thereof.

4. A signal input/output circuit for a semiconductor integrated circuit, comprising:
    a signal input/output terminal which inputs an external signal from the outside of said semiconductor integrated circuit as well as outputs an internal signal generated at the inside of said semiconductor integrated circuit to the outside of said semiconductor integrated circuit;
    a signal generating circuit which is connected to said signal input/output terminal through a resistance and generates a predetermined signal at the inside of said semiconductor integrated circuit when said external signal is input to said signal input/output terminal;
    an N-channel transistor whose source is connected to the ground voltage source of said semiconductor integrated circuit and whose drain is connected to the end of said signal input/output terminal side of said resistance; and logical sum operating means for operating a logical sum of the output of said signal generating circuit and said internal signal, and outputting the result as said predetermined signal.

5. A signal input/output circuit for a semiconductor integrated circuit, comprising:

a signal input/output terminal which inputs an external signal from the outside of said semiconductor integrated circuit as well as outputs an internal signal generated at the inside of said semiconductor integrated circuit to the outside of said semiconductor integrated circuit;

a signal generating circuit which is connected to said signal input/output terminal through a resistance and generates a predetermined signal at the inside of said semiconductor integrated circuit when said external signal is input to said signal input/output terminal;

a P-channel transistor whose source is connected to the positive voltage source of said semiconductor integrated circuit and whose drain is connected to the end of said signal input/output terminal side of said resistance; and logical sum operating means for operating a logical sum of the output of said signal generating circuit and said internal signal, and outputting the result as said predetermined signal.

6. A reset signal input/output circuit for a semiconductor integrated circuit, comprising:

a reset signal input/output terminal which inputs an external reset requesting signal from the outside of said semiconductor integrated circuit as well as outputs an internal reset requesting signal generated at the inside of said semiconductor integrated circuit to the outside of said semiconductor integrated circuit;

internal reset requesting signal outputting means for, when said internal reset requesting signal is generated, outputting said internal reset requesting signal from said reset signal input/output terminal to the outside of said semiconductor integrated circuit;

a reset input circuit which generates a signal for resetting said semiconductor integrated circuit at the inside of said semiconductor integrated circuit when said external reset requesting signal is input to said reset signal input/output terminal or when said internal reset requesting signal is output from said reset signal input/output terminal; and means for making said reset input circuit generate said signal for resetting said semiconductor integrated circuit when said internal resetting requesting signal is generated, said means for making including first and second transistors.

7. A reset signal input/output circuit for a semiconductor integrated circuit, comprising:

a reset signal input/output terminal which inputs an external reset requesting signal from the outside of said semiconductor integrated circuit as well as outputs an internal reset requesting signal generated at the inside of said semiconductor integrated circuit to the outside of said semiconductor integrated circuit;

a reset input circuit which is connected to said reset signal input/output terminal through a resistance and generates a signal for resetting said semiconductor integrated circuit at the inside of said semiconductor integrated circuit when said external reset requesting signal is input to said reset signal input/output terminal;

a first N-channel transistor whose source is connected to the ground voltage source of said semiconductor integrated circuit, and whose drain is connected to the end of said signal input/output terminal side of said resistance, and which, when said internal reset requesting signal is transmitted to the gate, outputs said internal reset requesting signal from said reset signal input/output terminal to the outside of said semiconductor integrated circuit; and a second N-channel transistor whose source is connected to the ground voltage source of said semiconductor integrated circuit, and whose drain is connected to the end of said reset input circuit side of said resistance, and which makes said reset input circuit generate said signal for resetting said semiconductor integrated circuit when said internal reset requesting signal is transmitted to the gate thereof.

8. A reset signal input/output circuit for semiconductor integrated circuit as set forth in claim 7, wherein the following inequality $$(R \times Vcc)/(R+r) < Vth1$$

is satisfied in case of Vi=Vcc, when on-resistance of said N-channel transistor is R, input protection resistance value of said protection resistance is r, voltage of said reset signal input/output terminal is Vi, threshold voltage of said reset input circuit is Vth1 and said source voltage is Vcc.

9. A reset signal input/output circuit for a semiconductor integrated circuit, comprising:

a reset signal input/output terminal which inputs an external reset requesting signal from the outside of said semiconductor integrated circuit as well as outputs an internal reset requesting signal generated at the inside of said semiconductor integrated circuit to the outside of said semiconductor integrated circuit;

a reset input circuit which is connected to said reset signal input/output terminal through a resistance and generates a signal for resetting said semiconductor integrated circuit at the inside of said semiconductor integrated circuit when said external reset requesting signal is input to said reset signal input/output terminal;

a first P-channel transistor whose source is connected to the positive voltage source of said semiconductor integrated circuit, and whose drain is connected to the end of said signal input/output terminal side of said resistance, and which, when said internal reset requesting signal is transmitted to the gate, outputs said internal reset requesting signal from said reset signal input/output terminal to the outside of said semiconductor integrated circuit; and a second P-channel transistor whose source is connected to the positive voltage source of said semiconductor integrated circuit, and whose drain is connected to the end of said reset input circuit side of said resistance, and which makes said reset input circuit generate said signal for resetting said semiconductor integrated circuit when said internal reset requesting signal is transmitted to the gate thereof.

10. A reset signal input/output circuit for semiconductor integrated circuit as set forth in claim 9, wherein the following inequality $$(r \times Vcc)/(R+r) > Vth2$$

is satisfied in case of Vi=Vcc, when on-resistance of said P-channel transistor is R, input protection resistance value of said protection resistance is r, voltage of said reset signal input/output terminal is Vi, threshold voltage of said reset input circuit is Vth2 and said source voltage is Vcc.

11. A reset signal input/output circuit for a semiconductor integrated circuit, comprising:
 a reset signal input/output terminal which inputs an external reset requesting signal from the outside of said semiconductor integrated circuit as well as outputs an internal reset requesting signal generated at the inside of said semiconductor integrated circuit to the outside of said semiconductor integrated circuit;
 a reset input circuit which is connected to said reset signal input/output terminal through a resistance and generates a signal for resetting said semiconductor integrated circuit at the inside of said semiconductor integrated circuit when said external reset requesting signal is input to said reset signal input/output terminal;
 an N-channel transistor whose source is connected to the ground voltage source of said semiconductor integrated circuit and whose drain is connected to the end of said reset signal input/output terminal side of said resistance; and
 logical sum operating means for operating a logical sum of the output of said reset input circuit and said internal reset requesting signal, and outputting the result as said signal for resetting said semiconductor integrated circuit.

12. A reset signal input/output circuit for a semiconductor integrated circuit, comprising:
 a reset signal input/output terminal which inputs an external reset requesting signal from the outside of said semiconductor integrated circuit as well as outputs an internal reset requesting signal generated at the inside of said semiconductor integrated circuit to the outside of said semiconductor integrated circuit;
 a reset input circuit which is connected to said reset signal input/output terminal through a resistance and generates a signal for resetting said semiconductor integrated circuit at the inside of said semiconductor integrated circuit when said external reset requesting signal is input to said reset signal input/output terminal;
 a P-channel transistor whose source is connected to the positive voltage source of said semiconductor integrated circuit and whose drain is connected to the end of said reset signal input/output terminal side of said resistance; and
 logical sum operating means for operating a logical sum of the output of said reset input circuit and said internal reset requesting signal, and outputting the result as said signal for resetting said semiconductor integrated circuit.

13. A signal generating circuit for a semiconductor integrated circuit, comprising:
 an input terminal receiving an external signal;
 an output terminal outputting an internal signal generated within said semiconductor integrated circuit;
 a signal generator connected to said input and output terminals and generating a predetermined signal when the external signal is received at said input terminal; and
 first and second transistors connected to said signal generator, receiving said internal signal and driving said signal generator to generate the predetermined signal when the internal signal is received by said first and second transistors.

14. A signal generating circuit for a semiconductor integrated circuit, comprising:
 an input terminal receiving an external signal;
 an output terminal outputting an internal signal generated within said semiconductor integrated circuit;
 a signal generator connected to said input and output terminals and generating a predetermined signal when the external signal is received at said input terminal;
 a transistor connected to said signal generator, receiving said internal signal and driving said signal generator to generate the predetermined signal when the internal signal is received by said first and second transistors; and
 a logical sum circuit connected to said signal generator, receiving the predetermined and internal signals and performing a logical sum of the predetermined and internal signals.

* * * * *